(12) United States Patent
Ioffe et al.

(10) Patent No.: US 11,237,219 B2
(45) Date of Patent: Feb. 1, 2022

(54) RECOVERING DEFECTIVE BRANCHES AND/OR CELLS OF BATTERY PACKS BY DEEP DISCHARGES

(71) Applicant: Storedot Ltd., Herzeliya (IL)

(72) Inventors: Zvi Ioffe, Kfar Saba (IL); Leonid Krasovitsky, Rishon LeTzion (IL); Daniel Aronov, Netanya (IL)

(73) Assignee: STOREDOT LTD., Herzliya (IL)

( * ) Notice: Subject to any disclaimer, the term of this patent is extended or adjusted under 35 U.S.C. 154(b) by 206 days.

(21) Appl. No.: 16/729,560

(22) Filed: Dec. 30, 2019

(65) Prior Publication Data

US 2021/0199725 A1 Jul. 1, 2021

(51) Int. Cl.
| | |
|---|---|
| G01R 31/392 | (2019.01) |
| H01M 10/0525 | (2010.01) |
| H01M 10/48 | (2006.01) |
| H01M 10/44 | (2006.01) |
| G01R 31/3835 | (2019.01) |
| H01M 10/42 | (2006.01) |

(52) U.S. Cl.
CPC ....... *G01R 31/392* (2019.01); *G01R 31/3835* (2019.01); *H01M 10/0525* (2013.01); *H01M 10/425* (2013.01); *H01M 10/441* (2013.01); *H01M 10/443* (2013.01); *H01M 10/482* (2013.01); *H01M 2010/4271* (2013.01)

(58) Field of Classification Search
CPC ............. G01R 31/392; G01R 31/3835; H01M 10/0525; H01M 10/482; H01M 10/441; H01M 10/443; H01M 10/425; H01M 2010/4271; H02J 7/00

See application file for complete search history.

(56) References Cited

U.S. PATENT DOCUMENTS

| | | | |
|---|---|---|---|
| 2013/0260216 A1* | 10/2013 | Takei | H01M 4/383 429/163 |
| 2015/0048796 A1* | 2/2015 | Sherstyuk | H01M 10/425 320/129 |
| 2017/0214256 A1* | 7/2017 | Hardy | B60L 58/22 |
| 2018/0131213 A1* | 5/2018 | Nepote | H02J 7/345 |
| 2018/0198161 A1* | 7/2018 | Krasovitsky | H02J 7/00714 |
| 2018/0316197 A1* | 11/2018 | Zhang | H02J 7/0019 |
| 2020/0119411 A1* | 4/2020 | Krasovitsky | H02J 7/0048 |
| 2020/0328419 A1* | 10/2020 | Carney | H01M 4/525 |
| 2020/0373629 A1* | 11/2020 | Li | G01R 31/396 |
| 2021/0013555 A1* | 1/2021 | Pol | H01M 10/44 |

* cited by examiner

Primary Examiner — Stacy Whitmore
(74) Attorney, Agent, or Firm — Reches Patents

(57) ABSTRACT

Methods of managing a lithium ion battery and of recovering branches and/or cells in the battery are provided, as well as battery management systems (BMS) and batteries implementing the methods. Branches and/or cells may be recovered by slow and deep discharging, followed by slow charging—to increase capacity, cycling lifetime and/or enhance safety thereof. BMSs may be configured to diagnose defective branches and/or cells and manage the recovery procedure with respect to changing operational loads the battery and the available internal and external charging sources.

21 Claims, 5 Drawing Sheets

RECOVERING DEFECTIVE BRANCHES AND/OR CELLS OF BATTERY PACKS BY DEEP DISCHARGES

BACKGROUND OF THE INVENTION

1. Technical Field

The present invention relates to the field of energy storage, and more particularly, to management of lithium ion batteries.

2. Discussion of Related Art

Lithium ion batteries include packs of cells that vary in their performance and in the rates their performance degrades over time.

SUMMARY OF THE INVENTION

The following is a simplified summary providing an initial understanding of the invention. The summary does not necessarily identify key elements nor limit the scope of the invention, but merely serves as an introduction to the following description.

One aspect of the present invention provides a method of managing a lithium ion battery that comprises at least one branch having corresponding at least one lithium ion cell, the method comprising: monitoring operational parameters of the at least one branch and/or of the at least one lithium ion cell, detecting at least one defective cell and/or branch, redistributing an operation load of the lithium ion battery among cells and/or branches other than the at least one detected defective cell and/or branch, performing a recovery procedure on the at least one detected defective cell and/or branch, the recovery procedure comprising discharging thereof, with a first specified procedure, down to a recovery voltage threshold followed by charging thereof, with a second specified procedure, up to an operation voltage threshold—to increase capacity, cycling lifetime and/or enhance safety thereof, and reinstating an operation load distribution on all cells and/or branches of the lithium ion battery.

One aspect of the present invention provides a recovery method comprising: discharging at least one cell of a lithium ion battery, with a first specified procedure, down to a recovery voltage threshold, followed by charging of the at least one cell, with a second specified procedure, up to an operation voltage threshold—to increase capacity, cycling lifetime and/or enhance safety thereof.

One aspect of the present invention provides a lithium ion battery comprising: a plurality of branches, each comprising a plurality of serially-connected cells, and a battery management system (BMS) configured to manage an operation of the lithium ion battery by distributing an operational load among the branches; wherein the BMS is further configured to detect at least one defective cell and/or branch, redistribute the operation load among cells and/or branches other than the at least one detected defective cell and/or branch, recover the at least one detected defective cell and/or branch, by discharging thereof with a first procedure down to a recovery voltage threshold followed by charging thereof with a second procedure up to an operation voltage threshold—to increase capacity, cycling lifetime and/or enhance safety thereof, and reinstate the operation load distribution on all cells and/or branches of the lithium ion battery.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
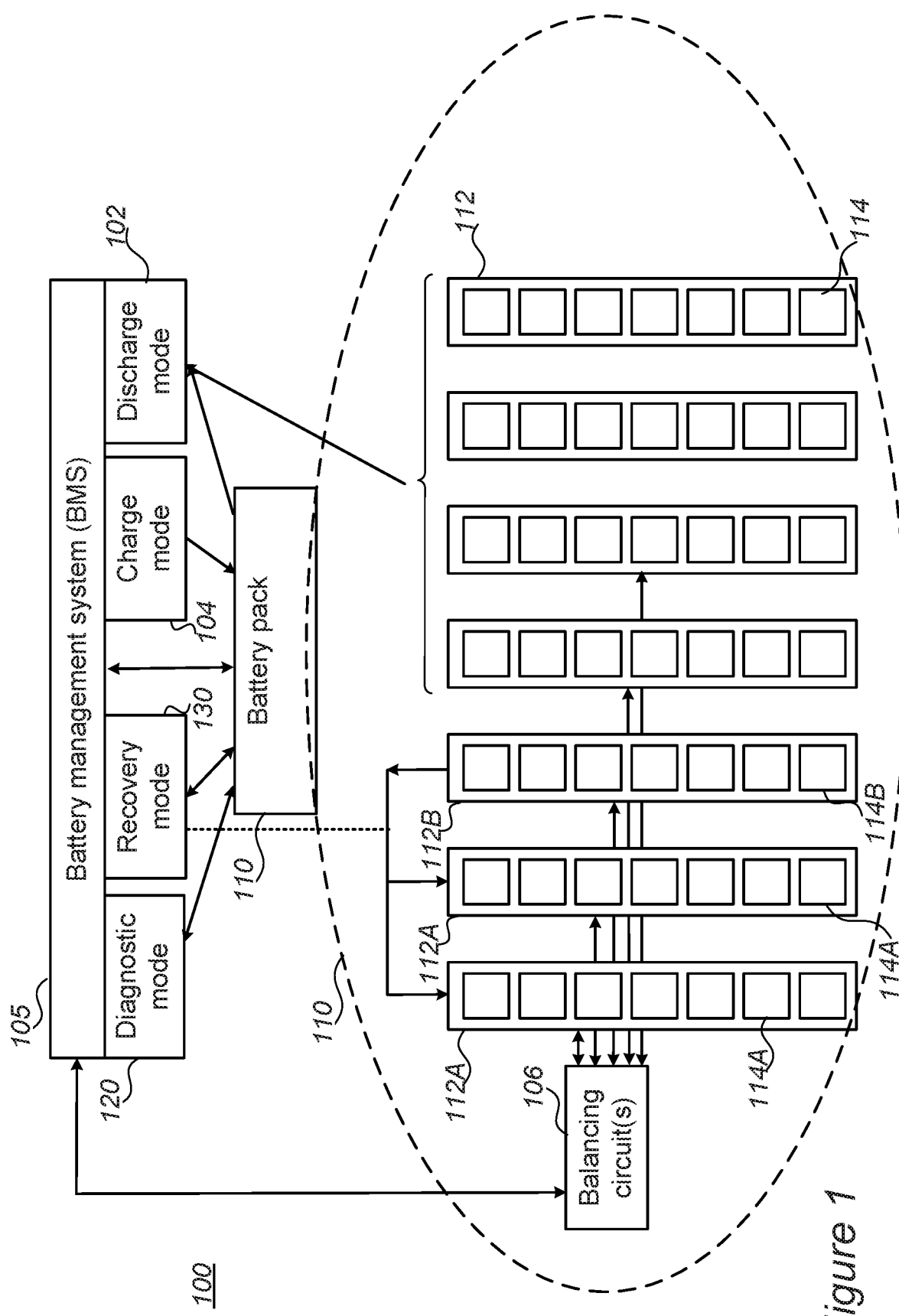
FIG. 1 is a high-level schematic illustration of a lithium ion battery, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing", "deriving" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention provide efficient and economical methods and mechanisms for managing cells and branches in battery packs and thereby provide improvements to the technological field of energy storage and supply. Methods of managing a lithium ion battery and of recovering branches and/or cells in the battery are provided, as well as battery management systems (BMS) and batteries implementing the methods. Branches and/or cells may be recovered by slow and deep discharging, followed by slow charging—to increase capacity and enhance safety thereof. BMSs may be configured to diagnose defective branches and/or cells and manage the recovery procedure with respect to changing operational loads the battery and the available internal and external charging sources. Disclosed recovery methods may be applied to lithium ion batteries used in a wide range of applications, such as, e.g., electric vehicle, E-bikes, UPS, energy storage systems, telecommunication base stations, E-scooters, E-tools, unmanned airplanes, golf carts, fork lifts, cleaning cars, electric wheelchairs, solar energy systems, etc.

FIG. 1 is a high-level schematic illustration of a lithium ion battery 100, according to some embodiments of the invention. Lithium ion battery 100 comprises a plurality of branches 112 forming a battery pack 110. Battery pack 110 may comprise a plurality of branches 112 connected in parallel. Each of branches 112 comprises a plurality of cells 114 (e.g., serially-connected cells 114). Lithium ion battery 100 may be operated in a discharging mode 102 to provide energy to given operational loads, in a charging mode 104, to receive energy from a power source, and in a diagnostic mode 120 and/or in a recovery mode 130, which are disclosed below.

Lithium ion battery 100 further comprises a battery management system (BMS) 105 configured to manage an operation of lithium ion battery 100 by distributing an operational load among branches 112. BMS 105 typically also monitors the state of health of battery 100 and provides predictions with respect to battery 100 and branches 112.

Moreover, BMS 105 typically operates cell balancing circuit (s) 106 (illustrated schematically), possibly applying passive or active balancing procedures that extend the cycling lifetime of the cells, and/or applying balancing procedures disclosed in U.S. patent application Ser. No. 16/360,272, which is incorporated herein by reference in its entirety.

BMS 105 may be configured to detect at least one defective cell 114A and/or branch 112A, e.g., in diagnostic mode 120, redistribute the operation load among cells 114 and/or branches 112 other than detected defective cell(s) 114A and/or branch(es) 112A, recover detected defective cell(s) 114A and/or branch(es) 112A, e.g., in recovery mode 130, and reinstate the operation load distribution on all cells 114 and/or branches 112 of lithium ion battery 100. For example, cell balancing circuit (s) 106 may be configured to detect defective cell(s) 114A and/or branches 112A and possible also control their recovery procedure of discharging and charging as disclosed herein. In various embodiments, the detection and/or the recovering may be carried out, at least partly by at least one cell balancing circuit 106 associated with BMS 105.

Recovering defective cell(s) 114A and/or branch(es) 112A may be carried out by applying a recovery procedure 135 that includes discharging them (136) with a first specified procedure (e.g., a CCCV (constant current, constant voltage) procedure and/or a series of CC (constant current), CI (constant impedance) and/or CP (constant power) procedures, each possibly comprising multiple recurring corresponding steps) down to a recovery voltage threshold followed by charging them (137) with a second specified procedure (e.g., any of a CCCV procedure and/or a series of CC, CI and/or CP procedures, each possibly comprising multiple recurring corresponding steps) up to an operation voltage threshold—to increase capacity and enhance safety thereof. For example, the recovery voltage threshold may be between 0-1.0V (e.g., any of 0.2V, 0.3V, 0.4V, 0.5V, 0.6V etc., or intermediate values in the specified range) or possibly within an extended range of 0-2.0V (e.g., any of 1.2V, 1.4V, 1.6V, 1.8V etc., or intermediate values in the specified range), and the operation voltage threshold may be between 2.5-4.5V (e.g., any of 3.0V, 3.5V, 4.0V or intermediate values in the specified range). In certain embodiments, the recovery voltage threshold may be 0.5V±0.5V and the operation voltage threshold may be 3V±0.5V.

In the schematic non-limiting example illustrated in FIG. 1, defective cell(s) 114A and branches 112A are shown to be recovered by charging them from other, operative, cells 114B and branch 112B during continued operation of battery pack 110. In the illustrated non-limiting example, battery pack 110 is operated in discharge mode 102 to supply a given operational load while defective cell(s) 114A and/or branches 112A are being recovered. In various embodiments, recovery of defective cell(s) 114A and/or branches 112A may be carried out during any of discharge mode 102, charge mode 104, between charging and discharging, in times with low operational load or during any combination of the above, possibly with respect to the required extent of recovery. In certain embodiments, the extent of recovery may be determined according to current and/or expected operational load on battery 100, e.g., at least some of the recovery may be carried out during an expected maintenance time or during an expected low-load operation time (e.g., during day or during night for various systems).

Figure 2A:
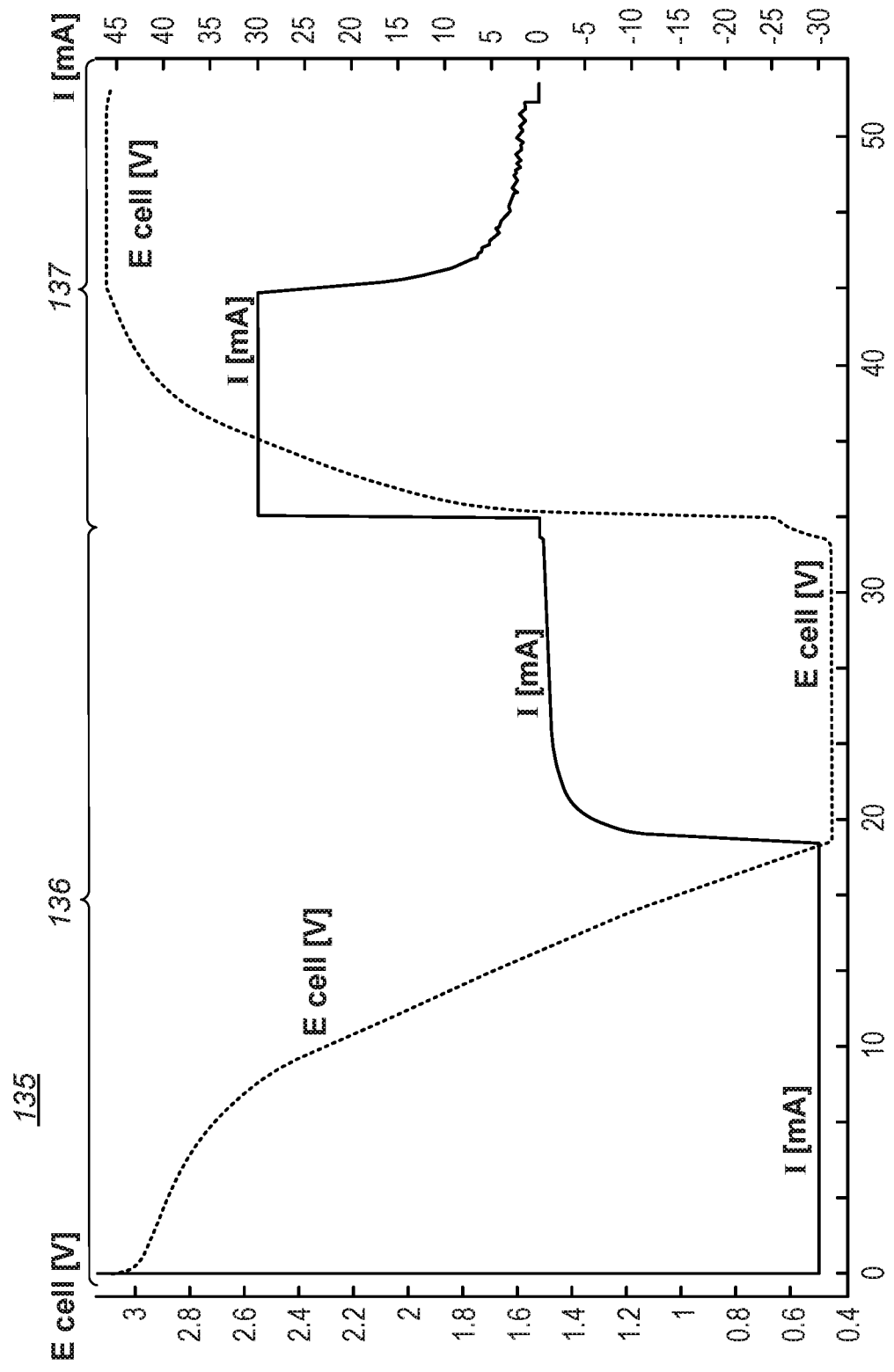
FIGS. 2A and 2B provide schematic non-limiting examples for recovery procedures, according to some embodiments of the invention.
Figure 2B:
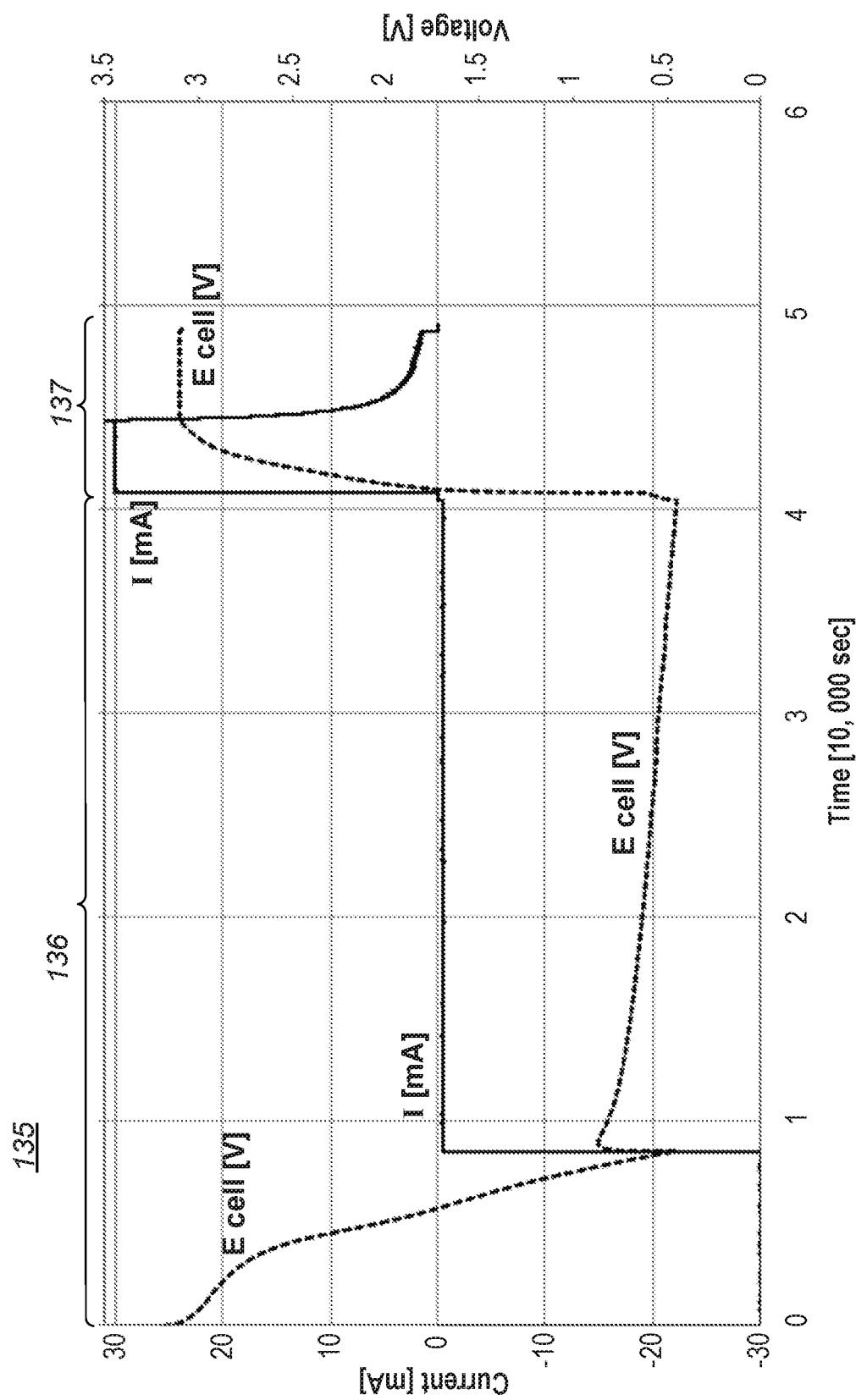

FIGS. 2A and 2B provide schematic non-limiting examples for recovery procedures 135, according to some embodiments of the invention. Recovery procedure 135 may comprise discharging 136 and consecutive charging 137 CCCV curves (in FIG. 2A) and/or CC curves (in FIG. 2B) configured to increase capacity and enhance safety of the recovered cells and/or branches. The inventors suggest, without being limited by theory, that deep discharging of defective cells 114A to low voltages such as 0.45V or similar values followed by gradual charging of the discharged cells back to voltages of 3V or similar values, by slow CCCV procedures and/or by slow CC procedures, recover and possibly reform the cells, e.g., renewing the formation procedure and stabilizing internal structures of the cell, such as any of the anode, SEI (solid electrolyte interphase) layer formed on the anode, the cathode, the electrolyte, various passivation layers, etc. The recovery procedure thus stabilizes internal structures and increases the cycling lifetime of the respective recovered cells. FIGS. 2A and 2B provide non-limiting examples for first (discharging) and second (charging) specified procedures 136, 137, respectively, which may be modified to any of the disclosed procedures, e.g., one or more CC, CV, CI and/or CP procedures in various temporal combinations, e.g., one or more steps of CCCV, CC, CV, CI, CP.

Recovery mode 130 (possibly in BMS 105, or optionally an independent module or an add-on) may be configured to manage the recovery procedure, which may be performed on one or more parallel connected branches 112A. Recovery mode 130 may apply the recovery procedure while standard charging and/or discharging procedures are carried out (e.g., in respective charging and discharging modes 104, 102), simultaneously and without significantly affecting the performance of battery 100. Recovery mode 130 may be configured to improve the capacity and enhance the safety performance of the recovered cells. It is noted that charging and discharging modes 104, 102 may be operated with respect to external sources (e.g., charger/outlet and loads, respectively) and/or with respect to internal sources (e.g., parts of battery 110 and/or associated batteries). The charged capacity of branches 112A that are recovered may be redistributed between several partially discharged branches 112A. Diagnostic mode 120 may be configured to identify branches 112A that require recovery and the redistribution of the operation load may be handled according to the operational requirements from battery 100. The diagnostics procedures may run during any of: the normal battery operation, a specially dedicated down time, charging and/or discharging, or combinations thereof. After the recovery procedure the recovered branches may be charged either during the grid charging of the entire battery, or from other branch(es) 112B of battery 100, e.g., branches 112B that are not under working load. BMS 105 may be configured to handle branch recovery with respect to changing operational loads on battery 100, e.g., during times with higher/lower operational loads, more/fewer branches may be used to supply the required workload and/or to charge the recovered branches. For example, re-charging 137 of recovered branches 112A may be scheduled to times of lower operational load on battery 100 as a whole. In various embodiments, BMS 105 may coordinate recovery mode 130 with diagnostic mode 120 to adjust the performance of the recovery procedure according to the variation in operation conditions of battery 100, such as varying impedance, operation temperature, open circuit voltage, etc. The recovery procedure may be carried out on single or few cells 114A and/or on branches 112A having one or few defective cells 114A.

It is emphasized that disclosed recovery procedures may be applied to any of one or more individual detected cells 114A, one or more individual detected branches 112A, one or more branches 112A that include detected cells 114A, even if other cells 114B in the respective branch(es) were not detected as defective. The inventors have noted that applying the disclosed recovery procedures to cells 114B which were not detected as defective—does not damage them.

In certain embodiments, recovery mode 130 may be further configured to determine whether to apply the disclosed recovery procedure to individual detected cells 114A, to detected branches 112A and/or to branches 112A that include detected cells 114A—depending, e.g., on local parameters such as the imbalance among the cells of respective branches 112A, on global parameters such as the charge level of battery pack 110 and possibly also on user experience or definitions. For example, if battery pack 110 is fully charged (at 100% SoC), recovery procedure may be performed on individual cells 114A and not on whole branches 112A including them, in order to reduce the amount of discharge energy—as the fully charged battery pack 110 does not provide cells 114 that are available to accept the discharged energy from detected cells 114A. The discharged energy may be supplied to a load, used to charge other cells if such are available, or may be removed from the system. Alternatively or complementarily, the recovery of cells 114A may be delayed until there are cells available to receive the energy discharged from them. In another example, if battery pack 110 is partly charged (e.g., at lower than 100% SoC, e.g., 90% SoC or lower) and not being discharged, recovery procedure may be performed on whole branches 112A that include detected cells 114A, as there are cells 114 in pack 110 that are available to receive discharged energy from branches 112A.

In various embodiments, BMS 105 may be configured to detect defective cell(s) 114A and/or branch(es) 112A using measurement data, e.g., from one or more sensors (not shown), e.g., according to temperature, internal pressure, discharge/charge capacity, DC (direct current) resistance or impedance. In various embodiments, BMS 105 may be configured to calculate the recovery voltage threshold using measurement data, e.g., from one or more sensors (not shown), e.g., according to temperature, internal pressure, discharge/charge capacity, DC resistance or impedance.

Figure 3:
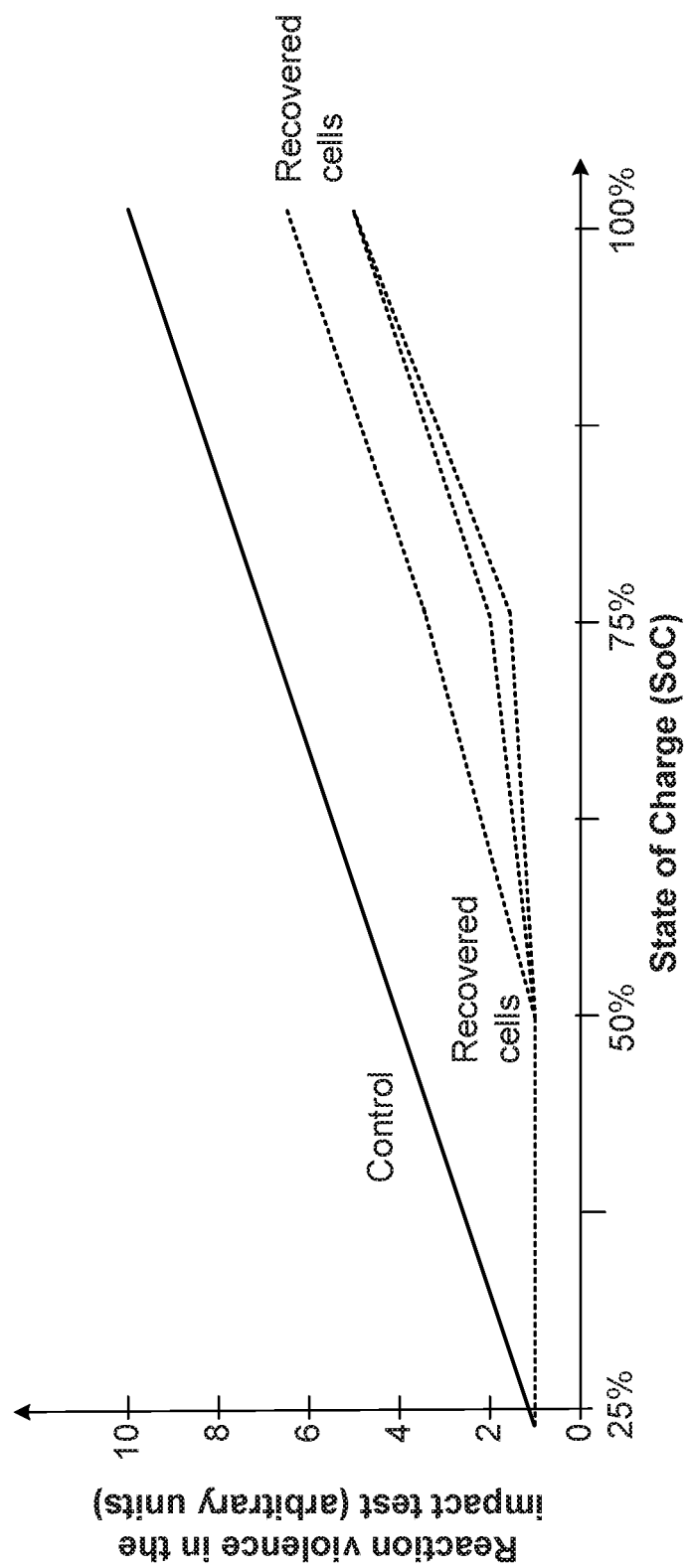
FIG. 3 provides experimental results concerning the safety of the lithium ion batteries, according to some embodiments of the invention.

FIG. 3 provides experimental results concerning the safety of lithium ion battery 100, according to some embodiments of the invention. FIG. 3 provides data on cells 114A that reached a quarter cycling lifetime threshold (125 cycles in this non-limiting case), and compares the extent to which recovered cells and un-recovered cells pass an impact test that is designed to determine the battery's structural and chemical stability and safety. In the applied impact test (under UL 1642 standard for lithium batteries), a cylindrical steel rod (e.g., ⅝ inch, 15.8 mm long) was placed across the tested cell and a weight (e.g., 20 pounds, 9.1 kg) was dropped (from a height of 24 inches, 610 mm) on the battery to apply mechanical impact onto it. To pass the impact test, the battery must not explode or ignite. FIG. 3 compares the reaction violence resulting from the impact test for control cells with the results for recovered cells, indicating the greater safety of the latter, and also relates the results to the state of charge (SoC) of cells 114A—indicating that the recovered cells are safer than control cells over the full range of SoC values.

Figure 4:
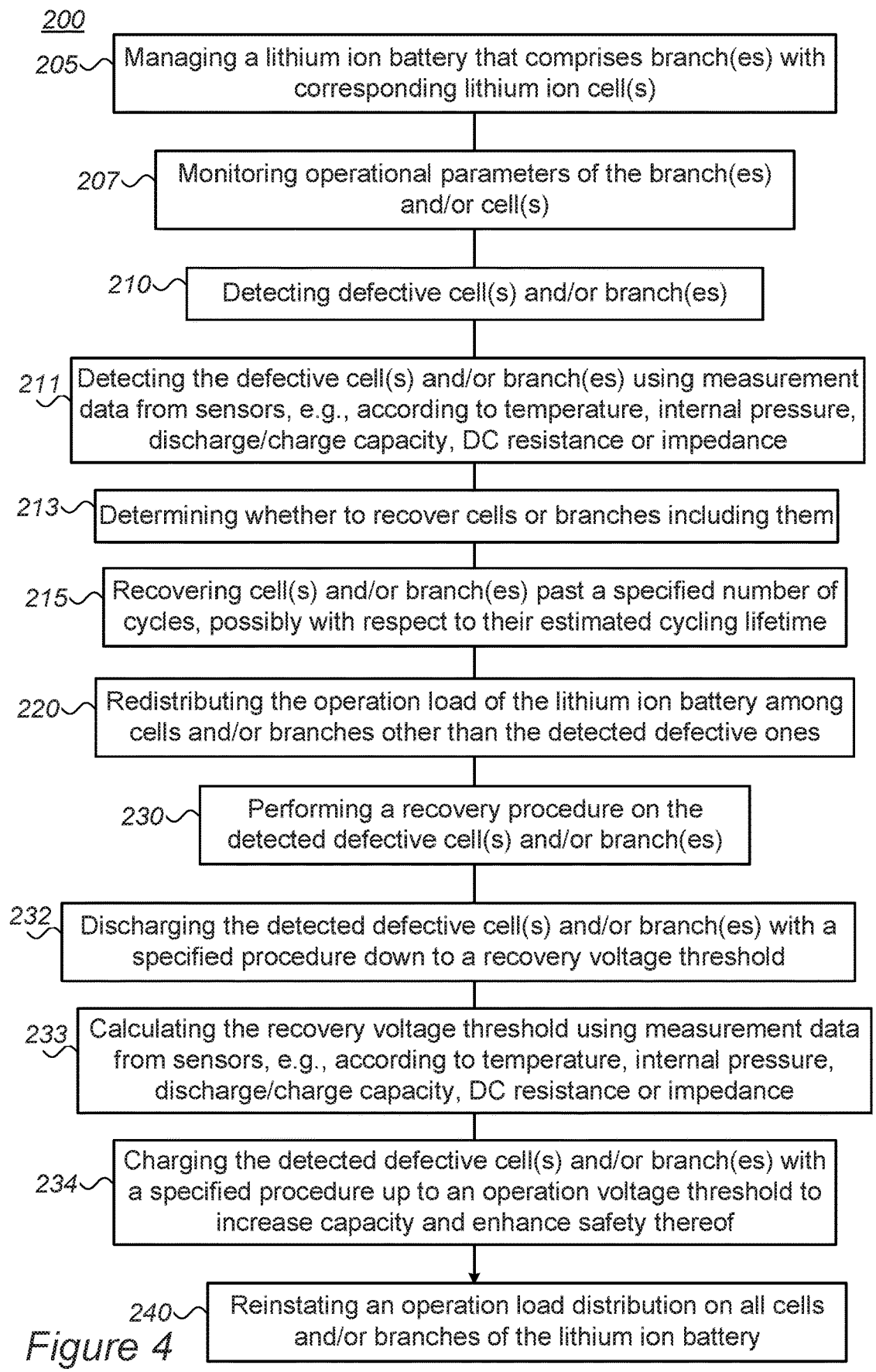
FIG. 4 is a high-level flowchart illustrating a method, according to some embodiments of the invention.

FIG. 4 is a high-level flowchart illustrating a method 200, according to some embodiments of the invention. The method stages may be carried out with respect to lithium ion battery 100 and/or BMS 105 described above, which may optionally be configured to implement method 200. Method 200 may be at least partially implemented by at least one computer processor, e.g., in a BMS. Certain embodiments comprise computer program products comprising a computer readable storage medium having computer readable program embodied therewith and configured to carry out the relevant stages of method 200. Method 200 may comprise the following stages, irrespective of their order.

Method 200 comprises managing a lithium ion battery that comprises at least one branch having corresponding at least one lithium ion cell (stage 205). Method 200 may comprise monitoring operational parameters of the at least one branch and/or of the at least one lithium ion cell (stage 207), detecting at least one defective cell and/or branch (stage 210), redistributing an operation load of the lithium ion battery among cells and/or branches other than the at least one detected defective cell and/or branch (stage 220), performing a recovery procedure on the at least one detected defective cell and/or branch (stage 230), the recovery procedure 230 comprising discharging thereof, with a first specified procedure, down to a recovery voltage threshold (stage 232) followed by charging thereof, with a second specified procedure, up to an operation voltage threshold—to increase capacity, cycling lifetime and/or enhance safety thereof (stage 234), and reinstating an operation load distribution on all cells and/or branches of the lithium ion battery (stage 240). The first and second specified procedures may comprise any of one or more CCCV, CC, CV, CI and/or CP procedures, each comprising at least one recurring corresponding step (e.g., one or more steps of CCCV, CC, CV, CI, CP).

In various embodiments, method 200 may comprise detecting the defective cell(s) and/or branch(es) using measurement data, e.g., from one or more sensors, e.g., according to temperature, internal pressure, discharge/charge capacity, DC resistance or impedance (stage 211). In certain embodiments, method 200 may further comprise determining whether to recover cells or branches including them (stage 213), e.g., according to local parameters such as the imbalance among the cells of the respective branches, and/or according to global parameters such as the charge level of the battery pack; and possibly also according to user experience or definitions. In various embodiments, method 200 may comprise calculating the recovery voltage threshold using measurement data, e.g., from one or more sensors, e.g., according to temperature, internal pressure, discharge/charge capacity, DC resistance or impedance (stage 233).

Method 200 may be applied to at least one branch of the lithium ion battery that includes a plurality of corresponding cells. The recovery voltage threshold may be between 0-1.0V (e.g., any of 0.2V, 0.3V, 0.4V, 0.5V, 0.6V etc., or intermediate values in the specified range) or possibly within an extended range of 0-2.0V (e.g., any of 1.2V, 1.4V, 1.6V, 1.8V etc., or intermediate values in the specified range), and the operation voltage threshold is between 2.5-4.5V (e.g., any of 3.0V, 3.5V, 4.0V or intermediate values in the specified range). In certain embodiments, the recovery voltage threshold may be 0.5V±0.5V and the operation voltage threshold may be 3V±0.5V.

Certain embodiments comprise recovery method 230 comprising: discharging 232 at least one cell of a lithium ion battery, with a first specified procedure, down to a recovery voltage threshold, followed by charging 234 of the at least one cell, with a second specified procedure, up to an operation voltage threshold—to increase capacity and enhance safety thereof. The first and second specified procedures may comprise any of one or more CCCV, CC, CV, CI and/or CP procedures, each comprising at least one recurring corresponding step (e.g., one or more steps of CCCV, CC, CV, CI, CP).

Recovery method 230 may be carried out with respect to a branch that comprises a plurality of serially-connected cells. Alternatively or complementarily, recovery method 230 may be carried out with respect to cells in the battery that exceed a specified number of operation cycles and/or exceed a specified part of their specified cycling lifetime (stage 215). In certain embodiments, recovery method 230 may be carried out with respect to cells in the battery that exceed a quarter of their specified expected cycling lifetime.

Recovery method 230 may comprise detecting the defective cell(s) and/or branch(es) and/or calculating the recovery voltage threshold—using measurement data, e.g., from one or more sensors, e.g., according to temperature, internal pressure, discharge/charge capacity, DC resistance or impedance (stages 211, 233, respectively).

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware, sensors and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method of managing a lithium ion battery that comprises at least one branch having corresponding at least one lithium ion cell, the method comprising:
   monitoring operational parameters of the at least one branch and/or of the at least one lithium ion cell,
   detecting at least one defective cell and/or branch, wherein the defective branch includes at least one defective cell,
   redistributing an operation load of the lithium ion battery among cells and/or branches other than the at least one detected defective cell and/or branch,
   performing a recovery procedure on the at least one detected defective cell and/or branch, the recovery procedure comprising discharging thereof, with a first specified procedure, down to a recovery voltage threshold followed by charging thereof, with a second specified procedure, up to an operation voltage threshold—to increase capacity, cycling lifetime and/or enhance safety thereof, and
   reinstating the operation load distribution on all cells and/or branches of the lithium ion battery.

2. The method of claim 1, wherein the first and second specified procedures, each independently comprises at least one of CCCV (constant current, constant voltage), CC (constant current), CV (constant voltage), CI (constant impedance) and/or CP (constant power) procedures, each comprising at least one recurring corresponding step.

3. The method of claim 1, applied to at least one branch of the lithium ion battery that includes a plurality of corresponding cells.

4. The method of claim 1, further comprising determining whether to recover detected cells or branches including them.

5. The method of claim 1, wherein the recovery voltage threshold is between 0-1.0V or between 0-2.0V and the operation voltage threshold is between 2.5-4.5V or between 2.5-5V or within 3V±0.5V.

6. The method of claim 1, further comprising calculating the recovery voltage using measurement data from at least one sensor.

7. The method of claim 1, further comprising calculating the recovery voltage using at least one of: a temperature, an internal pressure, a discharge capacity, a charge capacity, a DC (direct current) resistance or impedance.

8. The method of claim 1, wherein the detecting is carried out according to at least one of: a temperature, an internal pressure, a discharge capacity, a charge capacity, a DC resistance or impedance.

9. The method of claim 1, wherein the detecting is carried out with respect to cells in the battery that exceed a specified number of operation cycles and/or exceed a specified part of their specified cycling lifetime.

10. The method of claim 9, wherein the detecting is carried out with respect to cells in the battery that exceed a quarter of their specified cycling lifetime.

11. A recovery method comprising:
    discharging at least one cell of a lithium ion battery, with a first specified procedure, down to a recovery voltage threshold, followed by
    charging the at least one cell, with a second specified procedure, up to an operation voltage threshold—to increase capacity, cycling lifetime and/or enhance safety thereof,
    wherein the first and second specified procedures, each independently comprises at least one of CCCV (constant current, constant voltage), CC (constant current), CV (constant voltage), CI (constant impedance) and/or CP (constant power) procedures, each comprising at least one recurring corresponding step.

12. The recovery method of claim 11, carried out with respect to a branch that comprises a plurality of serially-connected cells.

13. The recovery method of claim 11, carried out with respect to cells in the battery that exceed a specified number of operation cycles and/or exceed a specified part of their specified cycling lifetime.

14. The recovery method of claim 11, carried out with respect to cells in the battery that exceed a quarter of their specified cycling lifetime.

15. The recovery method of claim 11, carried out with respect to cells in the battery that are detected by at least one of: a temperature, an internal pressure, a discharge capacity, a charge capacity, a DC resistance or impedance.

16. A lithium ion battery comprising:
    a plurality of branches, each comprising a plurality of serially-connected cells, and
    a battery management system (BMS) configured to manage an operation of the lithium ion battery by distributing an operational load among the branches;
    wherein the BMS is further configured to:
      detect at least one defective cell and/or branch, wherein the defective branch includes at least one defective cell,
      redistribute the operation load among cells and/or branches other than the at least one detected defective cell and/or branch,
      recover the at least one detected defective cell and/or branch, by discharging thereof, with a first specified procedure, down to a recovery voltage threshold followed by charging thereof, with a second specified procedure, up to an operation voltage threshold—to increase capacity, cycling lifetime and/or enhance safety thereof, and
      reinstate the operation load distribution on all cells and/or branches of the lithium ion battery.

17. The lithium ion battery of claim 16, wherein the detection and/or the recovering are carried out by at least one cell balancing circuit associated with the BMS.

18. The lithium ion battery of claim 16, wherein the first and second specified procedures, each independently comprises at least one of CCCV (constant current, constant voltage), CC (constant current), CV (constant voltage), CI (constant impedance) and/or CP (constant power) procedures, each comprising at least one recurring corresponding step.

19. The lithium ion battery of claim 16, wherein the BMS is configured to detect the at least one defective cell and/or branch according to least one of: a temperature, an internal pressure, a discharge capacity, a charge capacity, a DC resistance or impedance.

20. The lithium ion battery of claim 16, wherein the BMS is configured to detect the at least one defective cell and/or branch with respect to cells in the battery that exceed a specified number of operation cycles and/or exceed a specified part of their specified cycling lifetime.

21. The lithium ion battery of claim 20, wherein the BMS is configured to detect the at least one defective cell and/or branch with respect to cells in the battery that exceed a quarter of their specified cycling lifetime.

\* \* \* \* \*